US012638473B2

(12) United States Patent
Hwang et al.

(10) Patent No.: US 12,638,473 B2
(45) Date of Patent: May 26, 2026

(54) SOCKET DEVICE FOR TESTING ICS

(71) Applicants: HICON CO., LTD., Seongnam-si (KR); Dong Weon Hwang, Seongnam-si (KR); Jae Baek Hwang, Seongnam-si (KR)

(72) Inventors: Dong Weon Hwang, Seongnam-si (KR); Jae Baek Hwang, Seongnam-si (KR); Jae Woo Park, Yongin-si (KR); Hyung Suk Park, Cheonan-si (KR); Seung Woo Rhee, Seongnam-si (KR)

(73) Assignees: HICON CO., LTD., Seongnam-si (KR); Dong Weon Hwang, Seongnam-si (KR); Jae Baek Hwang, Seongnam-si (KR)

( * ) Notice: Subject to any disclaimer, the term of this patent is extended or adjusted under 35 U.S.C. 154(b) by 60 days.

(21) Appl. No.: 18/402,696

(22) Filed: Jan. 2, 2024

(65) Prior Publication Data

US 2024/0230715 A1    Jul. 11, 2024

(30) Foreign Application Priority Data

Jan. 10, 2023    (KR) ........................ 10-2023-0003637

(51) Int. Cl.
*G01R 1/04* (2006.01)
*G01R 1/067* (2006.01)
*G01R 31/28* (2006.01)
(52) U.S. Cl.
CPC ......... *G01R 1/045* (2013.01); *G01R 1/06722* (2013.01); *G01R 31/2889* (2013.01)

(58) Field of Classification Search
None
See application file for complete search history.

(56) References Cited

U.S. PATENT DOCUMENTS

| | | | |
|---|---|---|---|
| 7,470,149 B2 * | 12/2008 | Kazama | G01R 1/07371 |
| | | | 439/607.05 |
| 7,656,175 B2 * | 2/2010 | Fukushima | G01R 1/045 |
| | | | 324/750.2 |
| 9,685,722 B2 * | 6/2017 | Ueyama | H05K 1/18 |
| 9,689,897 B2 * | 6/2017 | Rathburn | G01R 1/0466 |
| 9,761,520 B2 * | 9/2017 | Rathburn | H10W 70/479 |

(Continued)

FOREIGN PATENT DOCUMENTS

| | | |
|---|---|---|
| KR | 10-0584225 B1 | 5/2006 |
| KR | 10-1058146 B1 | 8/2011 |

(Continued)

*Primary Examiner* — Richard Isla
(74) *Attorney, Agent, or Firm* — You & IP, LLC

(57) ABSTRACT

Proposed is a socket device used for testing integrated circuits (ICs) and, more particularly, a test socket device with a thin structure especially suitable for ICs required to process high-speed signals. The socket device includes a socket body configured to accommodate a ground probe and a signal probe, each having an upper contact pin, a lower contact pin and a coil spring, and to have noise shielding properties, and an insulating thin film member having electrical insulation properties and attached to the lower part or upper/lower parts of the socket body to elastically support the probes, and thus the socket device has a thin structure suitable for ICs required to process high-speed signals, and is easy to manufacture.

20 Claims, 6 Drawing Sheets

(56)     References Cited

U.S. PATENT DOCUMENTS

| | | | | | |
|---|---|---|---|---|---|
| 10,613,137 | B2 * | 4/2020 | Mardi | ................ | G01R 31/2886 |
| 10,976,348 | B2 * | 4/2021 | Jeong | ................ | G01R 1/07378 |
| 2004/0212383 | A1 * | 10/2004 | Yanagisawa | ......... | G01R 1/0441 |
| | | | | | 324/754.08 |
| 2013/0065455 | A1 | 3/2013 | Kawata et al. | | |
| 2015/0168450 | A1 * | 6/2015 | Wooden | ............... | G01R 1/0466 |
| | | | | | 324/756.02 |

FOREIGN PATENT DOCUMENTS

| | | | |
|---|---|---|---|
| KR | 10-1534778 | B1 | 7/2015 |
| KR | 10-2055773 | B1 | 12/2019 |
| KR | 10-2080832 | B1 | 2/2020 |
| KR | 10-2141368 | B1 | 8/2020 |
| TW | 201208213 | A1 | 2/2012 |

* cited by examiner

SOCKET DEVICE FOR TESTING ICS

CROSS REFERENCE TO RELATED APPLICATION

The present application claims priority to Korean Patent Application No. 10-2023-0003637, filed Jan. 10, 2023, the entire contents of which is incorporated herein for all purposes by this reference.

BACKGROUND OF THE INVENTION

Field of the Invention

The present disclosure relates to a socket device used for testing integrated circuits (ICs) and, more particularly, to a test socket device with a thin structure especially suitable for ICs required to process high-speed signals.

Description of the Related Art

An integrated circuit (IC) is a high-density integration of electronic circuits, and during the manufacturing process, each electronic circuit undergoes a testing process to determine whether or not the electronic circuit is functional. The test process uses an inspection device that applies a test signal to leads of an IC being inspected, and the inspection device is not directly connected to the leads of the IC under test, but is connected through a test socket. The test socket consists of a probe that connects each lead of the IC to a terminal of a test printed circuit board (PCB) of the inspection device, and a socket that supports the probe. Probes and sockets that make up a test socket come in various forms, taking into account the operating frequency of an IC, type of lead (BGA, LGA, etc.), and pitch between leads.

Meanwhile, as ICs become highly integrated and fast response speeds and high-frequency signal transmission characteristics are required, in order to inspect ICs for high-speed signals over 10 GHz, a signal transmission path needs to be shortened, and thus it is very important to shorten the probe length. In general, a probe needs to secure a stable contact load and contact stroke with an IC, and when considering this, there are many problems in implementing short probe lengths. For example, it is difficult to manufacture a pogo pin-type probe with a length of less than 2 mm due to the structure thereof.

Accordingly, the inventor of the present disclosure proposed a spring contact capable of processing ultra-high-speed signals in Korean Patent No. 10-0584225 (Published May 29, 2006), Korean Patent No. 10-1058146 (Published Aug. 24, 2011), and Korean Patent No. 10-2080832 (Published Feb. 24, 2020).

DOCUMENTS OF RELATED ART (Patent Document 0001) Korean Patent No. 10-0584225 (Published May 29, 2006)
(Patent Document 0002) Korean Patent No. 10-1058146 (Published Aug. 24, 2011)
(Patent Document 0003) Korean Patent No. 10-2080832 (Published Feb. 24, 2020)

SUMMARY OF THE INVENTION

Accordingly, the present disclosure has been made keeping in mind the above problems occurring in the related art, and the present disclosure is intended to provide a test socket device with a thin structure especially suitable for ICs required to process high-speed signals (hereinafter abbreviated as "socket device").

In order to achieve the above objective, according to an embodiment of the present disclosure, there is provided a socket device for testing integrated circuits (ICs). The socket device includes: a ground probe and a signal probe, each having an upper contact pin, a lower contact pin assembled across the upper contact pin to enable mutual linear manipulation, and a coil spring elastically supporting the upper contact pin and the lower contact pin; a conductive socket body formed with a ground hole where the ground probe is accommodated and a signal hole where the signal probe is accommodated so that the ground probe and the signal probe are accommodated, and provided with a support portion for supporting upper ends of the ground probe and the signal probe; an insulating layer formed on a surface of the signal hole to electrically insulate the signal probe and the socket body; and an electrically-insulating lower insulating thin film member provided with a through hole where a lower tip portion of the ground probe or the signal probe protrudes to support lower ends of the probes, and attached to a lower part of the socket body.

In addition, according to another aspect of the present disclosure, there is provided a socket device for testing integrated circuits (ICs). The socket device includes: a ground probe and a signal probe, each having an upper contact pin, a lower contact pin assembled across the upper contact pin to enable mutual linear manipulation, and a coil spring elastically supporting the upper contact pin and the lower contact pin; a socket body with electrical insulation properties formed with a ground hole where the ground probe is accommodated and a signal hole where the signal probe is accommodated so that the ground probe and the signal probe are accommodated, and provided with a support portion for supporting upper ends of the ground probe and the signal probe; a plating layer formed on a surface of the ground hole to make electrical contact with the ground hole; and an electrically-insulating lower insulating thin film member provided with a through hole where a lower tip portion of the ground probe or the signal probe protrudes to support lower ends of the probes, and attached to a lower part of the socket body.

In addition, according to still another aspect of the present disclosure, there is provided a socket device for testing integrated circuits (ICs). The socket device includes: a ground probe and a signal probe, each having an upper contact pin, a lower contact pin assembled across the upper contact pin to enable mutual linear manipulation, and a coil spring elastically supporting the upper contact pin and the lower contact pin; a conductive socket body formed with a ground hole where the ground probe is accommodated and a signal hole where the signal probe is accommodated so that the ground probe and the signal probe are accommodated; an insulating layer formed on a surface of the signal hole to electrically insulate the signal probe and the socket body; an electrically-insulating upper insulating thin film member provided with a first through hole where an upper tip portion of the ground probe or the signal probe protrudes to support upper ends of the probes, and attached to an upper part of the socket body; and an electrically-insulating lower insulating thin film member provided with a second through hole where a lower tip portion of the ground probe or the signal probe protrudes to support lower ends of the probes, and attached to a lower part of the socket body.

In addition, according to still another aspect of the present disclosure, there is provided a socket device for testing integrated circuits (ICs). The socket device includes: a ground probe and a signal probe, each having an upper contact pin, a lower contact pin assembled across the upper contact pin to enable mutual linear manipulation, and a coil spring elastically supporting the upper contact pin and the lower contact pin; a socket body with electrical insulation properties formed with a ground hole where the ground probe is accommodated and a signal hole where the signal probe is accommodated so that the ground probe and the signal probe are accommodated; a plating layer formed on a surface of the ground hole to make electrical contact with the ground hole; an electrically-insulating upper insulating thin film member provided with a first through hole where an upper tip portion of the ground probe or the signal probe protrudes to support upper ends of the probes, and attached to an upper part of the socket body; and an electrically-insulating lower insulating thin film member provided with a second through hole where a lower tip portion of the ground probe or the signal probe protrudes to support lower ends of the probes, and attached to a lower part of the socket body.

Preferably, a thickness h2 of the lower insulating thin film member may be $5/100 \leq h2/h1 \leq 20/100$ with respect to a thickness h1 of the socket body.

Preferably, thickness h3 of the upper insulating thin film member may be $5/100 \leq h3/h1 \leq 20/100$ with respect to a thickness h1 of the socket body.

Preferably, the lower insulating thin film member may be attached to the socket body using pressure-sensitive adhesives, adhesives, adhesive tapes, riveting, adhesion/bonding, or fusion.

Preferably, the upper insulating thin film member may be attached to the socket body using pressure-sensitive adhesives, adhesives, adhesive tapes, riveting, adhesion/bonding, or fusion.

A socket device for testing integrated circuits (ICs) according to the present disclosure includes: a socket body configured to accommodate a ground probe and a signal probe, each having an upper contact pin, a lower contact pin and a coil spring, and to have noise shielding properties; and an insulating thin film member having electrical insulation properties and attached to the lower part or upper/lower parts of the socket body to elastically support the probes, and thus the socket device has a thin structure suitable for ICs required to process high-speed signals, and is easy to manufacture.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Figure 1:
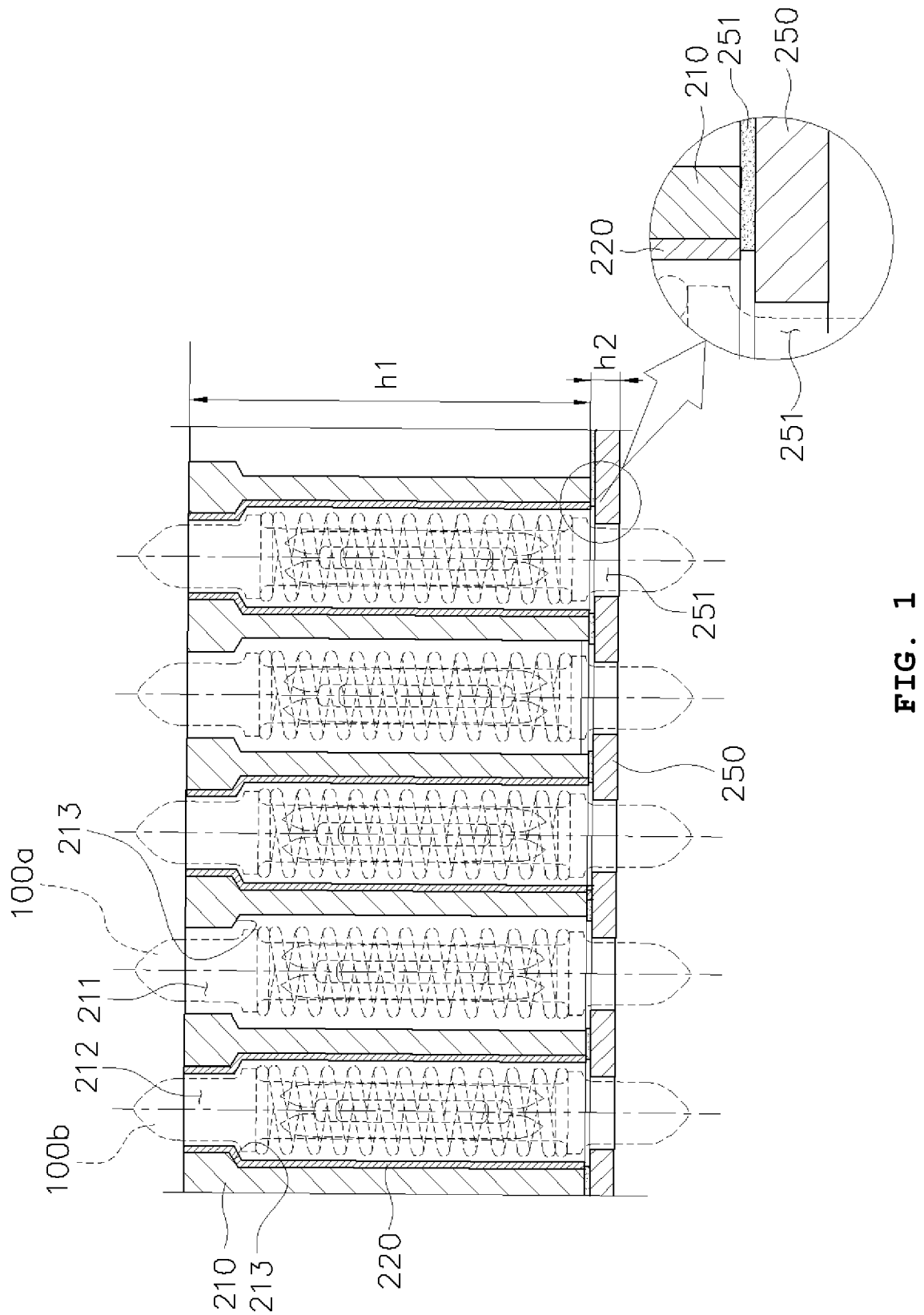
FIG. 1 is a cross-sectional view of a socket device according to an embodiment of the present disclosure.

Terms and words used in this specification and claims should not be construed as limited to their ordinary or dictionary meanings, and should be interpreted as meaning and concept consistent with the technical idea of the present disclosure on the basis of the principle that an inventor can appropriately define terminological concepts to best describe his or her invention.

Accordingly, an embodiment described in this specification and the configuration shown in the drawings are only one of the most preferred embodiments of the present disclosure, and do not represent the entire technical idea of the present disclosure. Therefore, it should be understood that at the time of filing this application, there may be various equivalents and modifications that can replace the embodiment and the configuration.

Hereinafter, preferred embodiments of the present disclosure will be described in detail with the accompanying drawings. Meanwhile, in the drawings below, the size of certain components may be relatively exaggerated to aid understanding of the invention, and parts assigned the same reference numerals indicate the same components.

FIG. 1 is a cross-sectional view of a socket device according to an embodiment of the present disclosure.

Referring to FIG. 1, a socket device of the present embodiment includes: a ground probe 100a and a signal probe 100b; a socket body 210 that is a conductor in which the probes 100a and 100b are accommodated; an insulating layer 220 formed on the surface of a signal hole 212; and a lower insulating thin film member 250 attached to the bottom of the socket body 210.

In the present embodiment, the probes 100a and 100b may consist of the ground probe 100a and the signal probe 100b. The ground probe 100a connects a ground lead of an integrated circuit (IC) and a ground terminal of a test printed circuit board (PCB), and the signal probe 100b connects a signal lead of the IC and a signal terminal (pad) of the test PCB. The ground probe 100a and the signal probe 100b make elastic contact with the leads of the IC and the terminals (pads) of the test PCB, and may be provided by probes of the same structure. The ground probe 100a and the signal probe 100b commonly include: an upper contact pin 110; a lower contact pin 120 assembled by crossing the upper contact pin 110 to enable mutual linear manipulation; and a coil spring 130 elastically supporting the upper contact pin 110 and the lower contact pin 120.

Figure 2A:
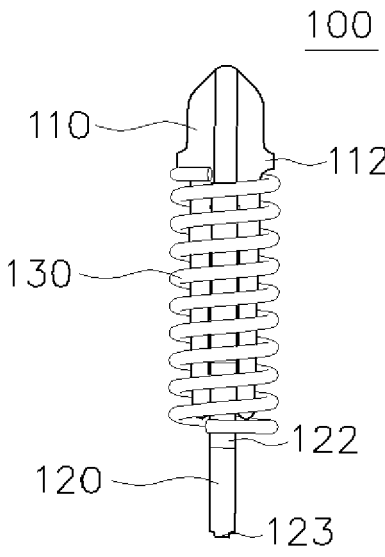
FIGS. 2A to 2D show a probe used in the socket device of the present disclosure, and exploded views of the probe.
Figure 2B:
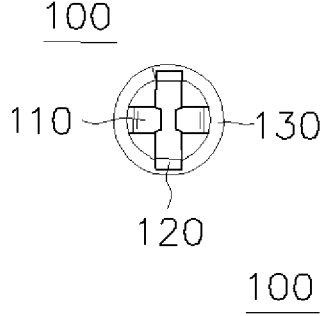
Figure 2C:
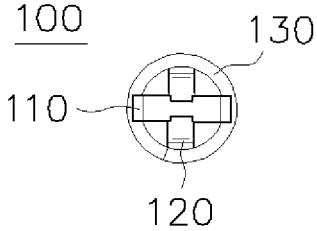
Figure 2D:
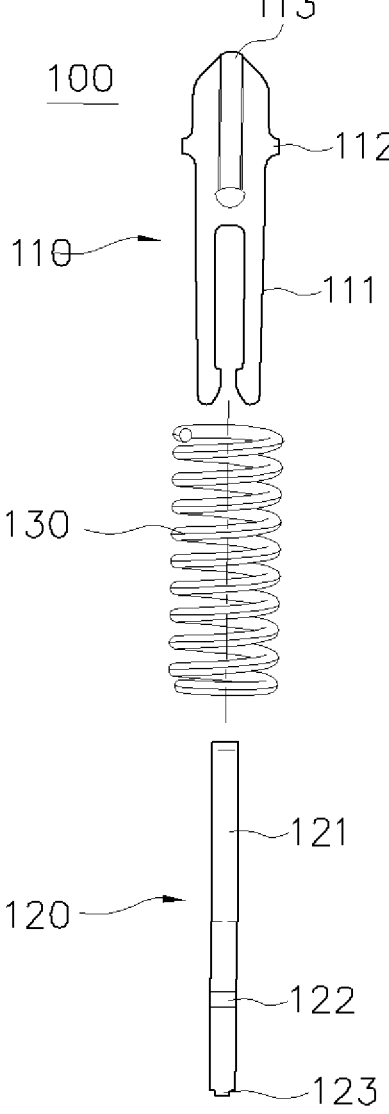

As a specific example, FIGS. 2A to 2D show a probe used in the socket device of the present disclosure, and exploded views of the probe. FIG. 2A is the front view, FIGS. 2B and 2C are the top view and the bottom view, respectively, and the FIG. 2D is the exploded view.

Referring to FIGS. 2A to 2D, a probe 100 of the present embodiment includes: the upper contact pin 110; the lower contact pin 120 assembled by crossing the upper contact pin 110 in the longitudinal direction; and the spring 130 inserted between the upper contact pin 110 and the lower contact pin 120 and elastically supporting the upper contact pin 110 and the lower contact pin 120. The upper contact pin 110 and the lower contact pin 120 have the same shape.

The upper contact pin 110 includes a pair of elastic portions 111 symmetrical left and right in the longitudinal direction and a pair of fixing protrusions 112 protruding left and right. The lower contact pin 120 also includes a pair of elastic portions 121 and a pair of fixing protrusions 122. The upper contact pin 110 and the lower contact pin 120 are assembled to each other with the elastic portions 111 and 121 crossing each other, and the upper contact pin 110 and the lower contact pin 120 are elastically supported in the vertical direction within the socket body by the spring 130 inserted between the two pairs of fixing protrusions 112 and 122. The upper contact pin 110 and the lower contact pin 120 each include an upper tip portion 113 and a lower tip portion 123 that are in direct contact with a lead of the IC and a terminal (pad) of the test PCB.

The probe 100 of the above structure is suitable as a high-speed signal probe because the probe 100 may be implemented in a short length (~1 mm) while securing a stable contact load and contact stroke. In relation to this, Korean Patent No. 10-0584225 (Published May 29, 2006), Korean Patent No. 10-1058146 (Published Aug. 24, 2011), and Korean Patent No. 10-2080832 (Published Feb. 24, 2020) which are the inventor's pre-registered patents, are disclosed.

Referring back to FIG. 1, the socket body 210 is a conductive member, has a ground hole 211 where the ground probe 110 is accommodated and a signal hole 212 where the signal probe 120 is accommodated so that the ground probe 100a and the signal probe 100b are respectively accommodated in the ground hole 211 and the signal hole 212, and includes a support portion 213 for supporting the upper ends of the ground probe 110 and the signal probe 120.

In the socket body 210, the support portion 213 may be provided by a step portion formed by a difference in diameter between the ground hole 211 and the signal hole 212, and the fixing protrusion 111 (see FIGS. 2A to 2D) on the upper part of the probe 100 is caught on the support portion 213 and is restricted from upward movement.

The socket body 210 serves as a shielding means that can shield noise between probes. In order to prevent short circuit of the signal probe 100b inserted into the signal hole 212, the signal probe 100b needs to be electrically insulated from the socket body 210. The insulating layer 220 is formed on the surface of the signal hole 212 to electrically insulate the signal probe 100b and the socket body 210. The ground probe 100a is inserted into the ground hole 211 and comes into direct contact with the socket body 210 through the support portion 213 to increase a grounding effect. The insulating layer 220 may be selectively formed in the signal hole 212 by using a known deposition process (CVD). The insulating material may be Si oxide or nitride, and Al oxide or Zr oxide may be used, but is not limited thereto.

The lower insulating thin film member 250 is an electrically insulating member, is provided with a through hole 251 where the lower tip portion of the ground probe 100a or the signal probe 100b protrudes to support the lower ends of the probes, and is attached to the lower part of the socket body 210. The diameter of the through hole 251 is at least smaller than the inner diameter of the ground hole 211 and the signal hole 212, and may be determined approximately within a range in which the fixing protrusion 122 (see FIGS. 2A to 2D) on the lower part of the probe 100 may be fixed.

The lower insulating thin film member 250 may be attached to the socket body 210 using pressure-sensitive adhesives or adhesives, and may be bonded by adhesive tapes 251. As other examples, riveting, ultrasonic fusion, etc. may be used. For reference, in the case of a conventional socket body, two or more members consisting of an upper body portion and a lower body portion to fix a probe are used, and after the probe is fixed between the upper body portion and the lower body portion, the upper body portion and the lower body portion are fastened with bolts to be secured. On the contrary, in the present disclosure, bolt fastening is excluded as a fixing method for the lower insulating thin film member, and the lower insulating thin film member may be fixed using pressure-sensitive adhesives, adhesives, adhesive tapes, riveting, or ultrasonic fusion, making the manufacturing process for the socket device easy.

Preferably, the thickness h2 of the lower insulating thin film member 250 is significantly lesser than the thickness h1 of the socket body 210 (h2<<h1), and the lower insulating thin film member 250 may be provided by a thin (<0.2 mm) insulating film or insulating plate. Preferably, the thickness h2 of the lower insulating thin film member 250 is 5/100≤h2/h1≤20/100 with respect to the thickness h1 of the socket body 210. For example, when the socket body 210 is about 1.0 mm, the thickness h2 of the lower insulating thin film member 230 is 0.05 to 0.20 mm, and when the socket body 210 is 0.5 mm or less, the thickness h2 of the lower insulating thin film member 230 is about 0.03 to 0.10 mm. For reference, when the operating frequency of an IC is 30 GHz, the wavelength λ is about 10 mm. Since the socket device of the present disclosure may be manufactured with a thickness of less than 1 mm (h1+h2), the thickness is significantly lesser (h1+h2≪λ) compared to the wavelength of the high-speed signal (over 30 GHz) of an IC being inspected, and thus noise shielding between probes is excellent, and deterioration of signal transmission characteristics due to socket devices may be prevented.

Figure 3:
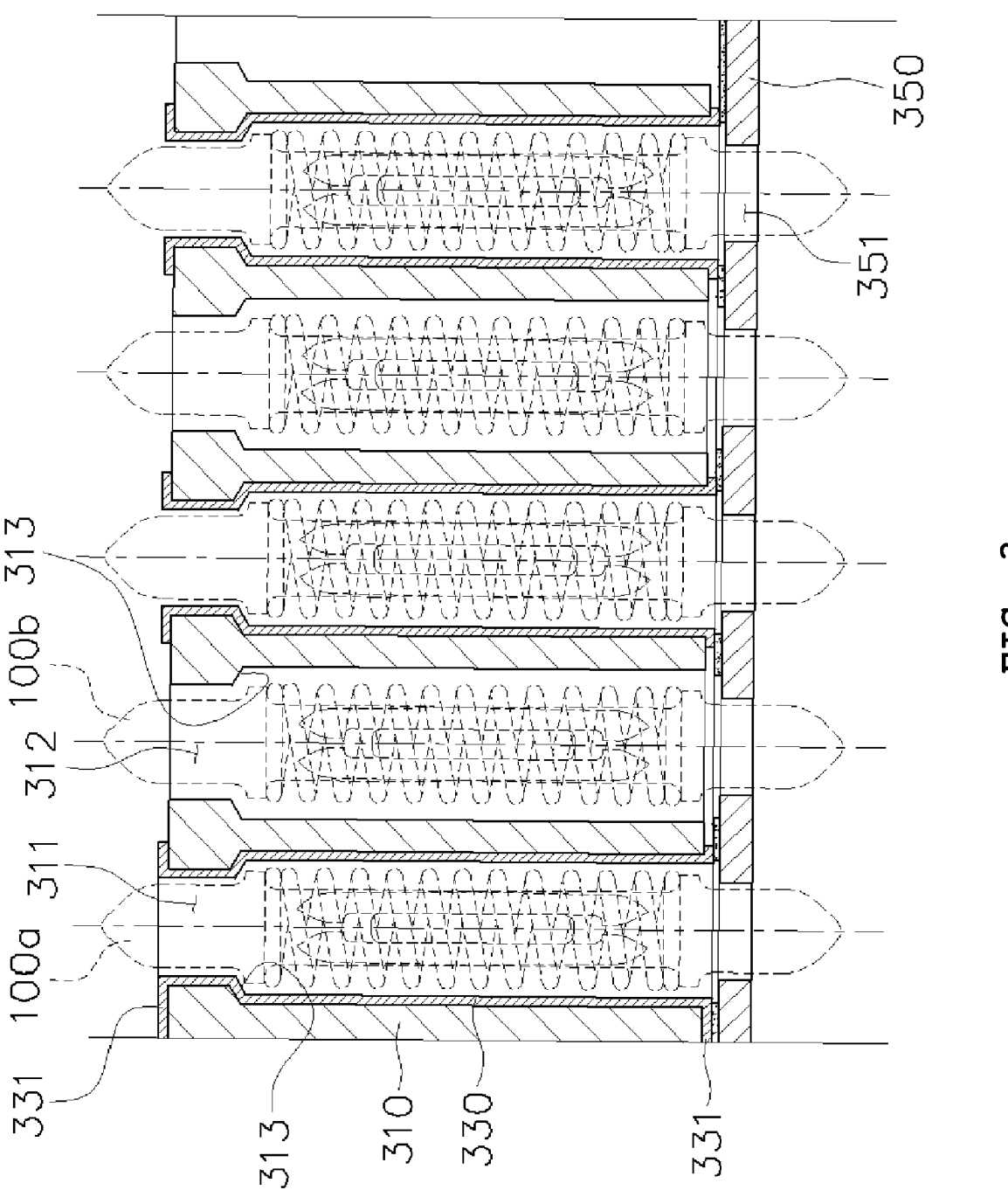
FIG. 3 is a cross-sectional view of a socket device according to another embodiment of the present disclosure.

FIG. 3 is a cross-sectional view of a socket device according to another embodiment of the present disclosure. For the same configuration as in the previous embodiment, the same numerals are used and overlapping descriptions are omitted.

Referring to FIG. 3, a socket device of this embodiment includes: a non-conducting socket body 310 in which probes 100a and 100b are accommodated; a plating layer 330 formed on the surface of a ground hole 311 into which a ground probe 100a is inserted; a lower insulating thin film member 350 attached to the bottom of the socket body 310.

The socket body 310 is a member with electrical insulation properties, has the ground hole 311 where the ground probe 100a is accommodated and a signal hole 312 where a signal probe 100b is accommodated so that the ground probe 100a and the signal probe 100b are respectively accommodated in the ground hole 311 and the signal hole 312, and includes a support portion 313 for supporting the upper ends of the ground probe 100a and the signal probe 100b.

In the socket body 310, the support portion 313 may be provided by a step portion formed by a difference in diameter between the ground hole 311 and the signal hole 312, and a fixing protrusion 111 (see FIGS. 2A to 2D) on the upper part of the probe 100 is caught on the support portion 313 and is restricted from upward movement, which is same as in the previous embodiment.

The plating layer 330 is formed on the surface of the ground hole 311 and makes electrical contact with the ground probe 100a to increase the grounding effect of the ground probe 100a. In addition, the plating layer 330 formed in the ground hole 311 serves as a shielding means for shielding noise between the signal probes 100b together with the ground probe 100a disposed around the signal probes 100b. Preferably, the socket body 310 further includes an outer plating layer 331 on the upper surface thereof that is electrically connected to the plating layer 330. The outer plating layer 331 is provided on the upper surface of the socket body 310 to the extent that the outer plating layer 331 does not directly contact the signal probe to secure a large grounding area. In the present embodiment, the outer plating layer 331 is shown to be formed on the lower surface of the socket body 310 as well as the upper surface of the socket body 310.

The lower insulating thin film member 350 is provided with a through hole 351 where the lower tip portion of the ground probe 100a or the signal probe 100b protrudes to support the lower ends of the probes, and is attached to the lower part of the socket body 310. As in the previous embodiment, the lower insulating thin film member 350 has a thickness significantly lesser than the thickness of the socket body 310.

Figure 4:
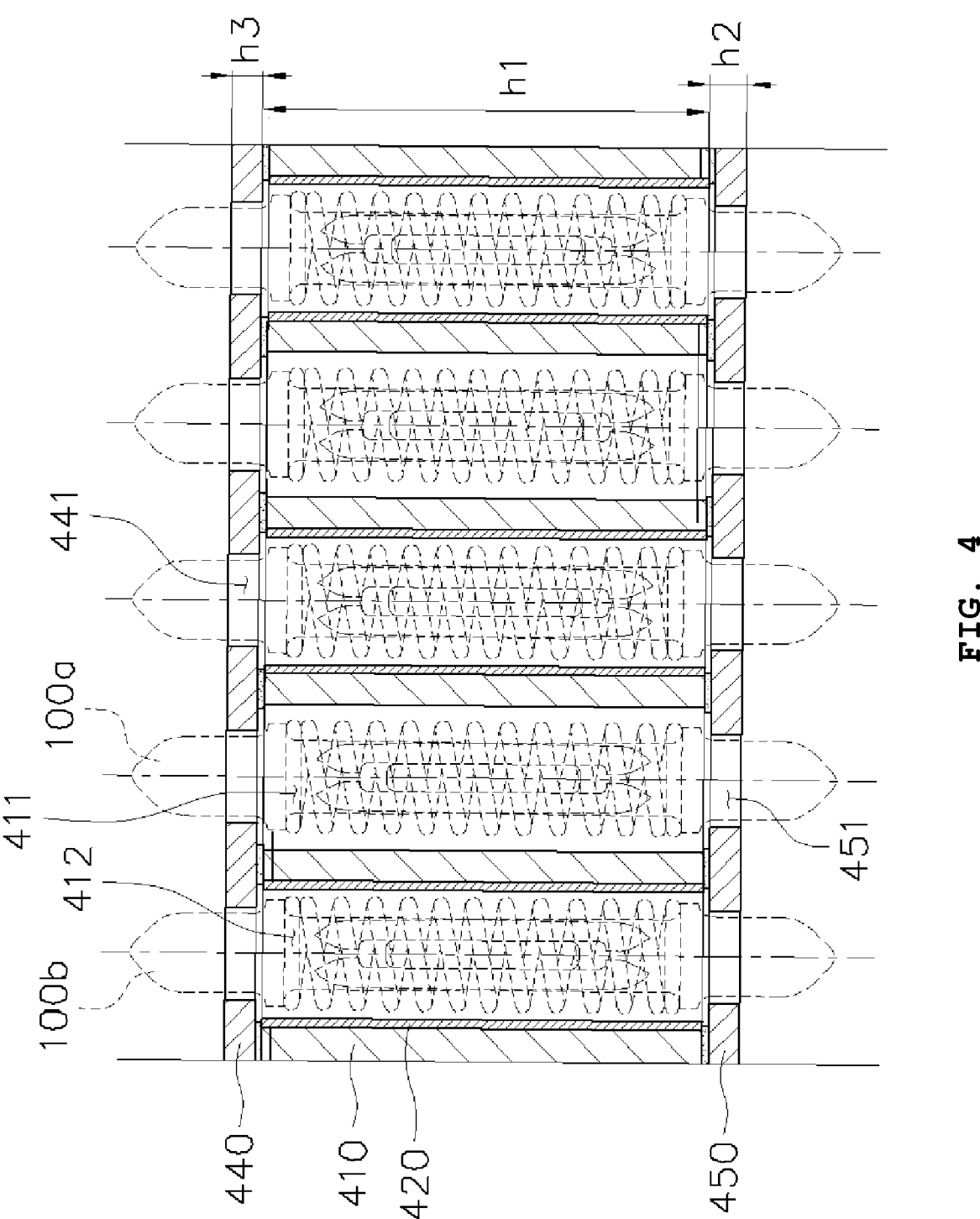
FIG. 4 is a cross-sectional view of a socket device according to still another embodiment of the present disclosure.

FIG. 4 is a cross-sectional view of a socket device according to still another embodiment of the present disclosure.

Referring to FIG. 4, a socket device of this embodiment includes: a conducting socket body 410 in which probes 100a and 100b are accommodated; an insulating layer 420 formed on the surface of a signal hole 412; an upper insulating thin film member 440 attached to the top of the socket body 410 and supporting the upper ends of the probes 100a and 100b; and a lower insulating thin film member 450 attached to the bottom of the socket body 410 and supporting the lower ends of the probes 100a and 100b.

The socket body 410 is formed with a ground hole 411 and a signal hole 412 having a single diameter, into which the ground probe 100a and the signal probe 100b are inserted, and the upper ends and the lower ends of the probes 100a and 100b are supported by the upper insulating thin film member 440 and the lower insulating thin film member 450, respectively.

The upper insulating thin film member 440 is formed with a first through hole 441 that is at least smaller than the inner diameter of the ground hole 411 or the signal hole 412, the lower insulating thin film member 450 is provided with a second through hole 451 that also is smaller than the inner diameter of the ground hole 411 or the signal hole 412. The upper fixing protrusion 112 (see FIGS. 2A to 2D) and the lower fixing protrusion 122 (see FIGS. 2A to 2D) of the probe 100 are respectively caught on the first through hole 441 and the second through hole 451 of the upper insulating thin film member 440 and the lower insulating thin film member 450, limiting the upward and downward stroke range of the probe 100.

Preferably, as described in the previous embodiments, the thickness h2 of the lower insulating thin film member 450 is determined within a range significantly lesser than the thickness h1 of the socket body 410. Likewise, the thickness h3 of the upper insulating thin film member 440 also is significantly lesser than that of the socket body 410. Preferably, the thickness h3 of the upper insulating thin film member 450 is 5/100≤h3/h1≤20/100 with respect to the thickness h1 of the socket body 410.

The insulating layer 420 is applied to the surface of the signal hole 412 of the socket body 410, which is a conductor, to electrically insulate the signal probe 100b and the socket body 410. As described in the previous embodiment (see FIG. 1), the socket body 410 and the ground probe 100a come into contact with each other to increase the grounding effect. In addition, due to the coaxial cable structure consisting of an outer conductor with the signal hole 412 as the inner diameter thereof, the signal probe 100b as an inner conductor, and an insulating layer between the conductors, signal transmission loss may be minimized.

According to the socket device of this embodiment configured as described above, since the upper ends and the lower ends of the probes 100a and 100b are supported by the thin film insulating members 440 and 450, respectively, the socket body 410, which accommodates the probes 100a and 100b, may be manufactured by machining holes of a single diameter, making it easy to manufacture the socket device.

Figure 5:
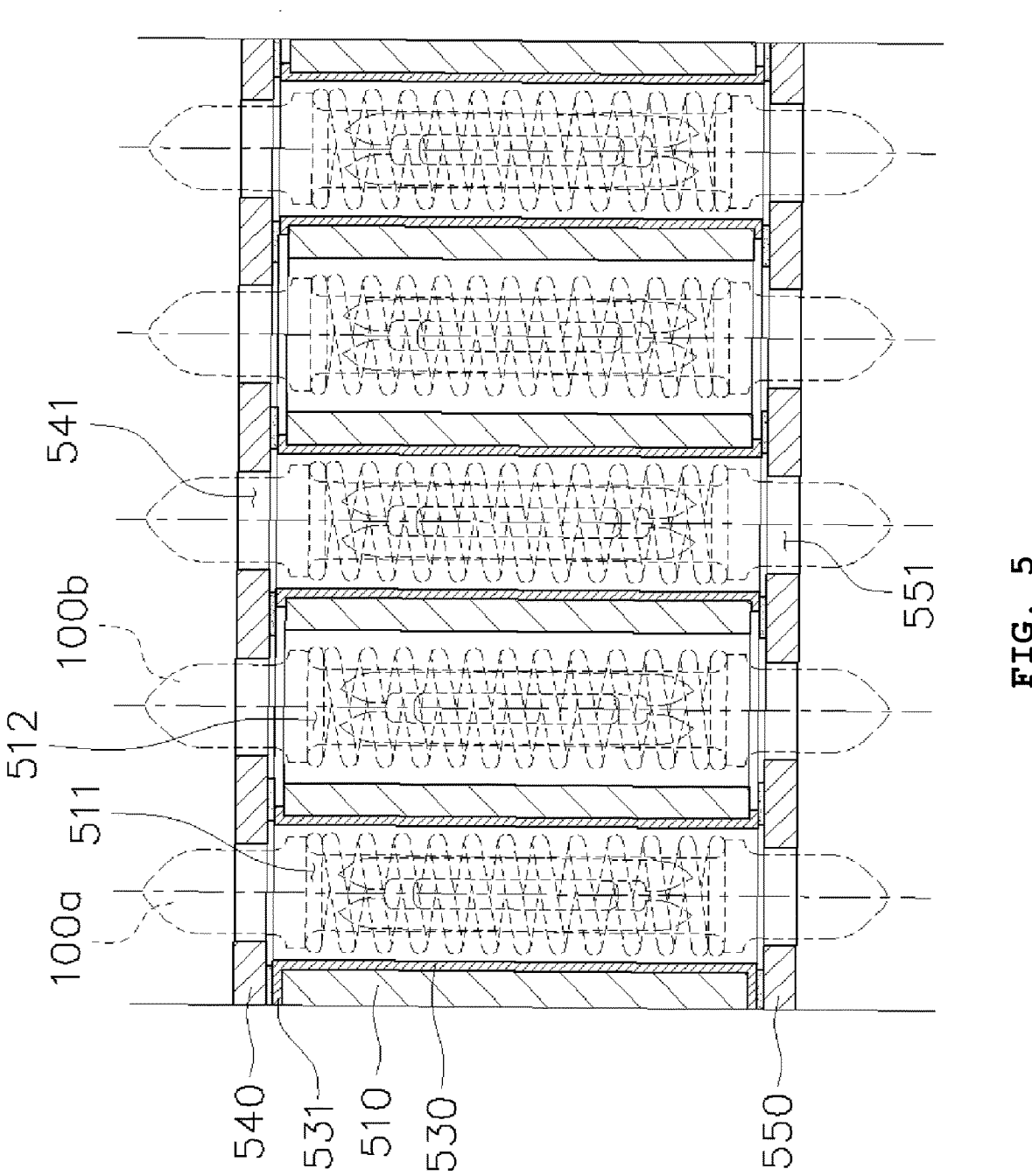
FIG. 5 is a cross-sectional view of a socket device according to still another embodiment of the present disclosure.

FIG. 5 is a cross-sectional view of a socket device according to still another embodiment of the present disclosure.

Referring to FIG. 5, a socket device of this embodiment includes: a non-conducting socket body 510 in which probes 100a and 100b are accommodated; a plating layer 530 formed on the surface of a ground hole 511; an upper insulating thin film member 540 attached to the top of the socket body 510 to support the upper ends of the probes 100a and 100b; and a lower insulating thin film member 550 attached to the bottom of the socket body 510 to support the lower ends of the probes 100a and 100b.

The socket body 510 is a member with electrical insulation properties, and is formed with the ground hole 511 and a signal hole 512 having a single diameter into which the ground probe 100a and the signal probe 100b are respectively inserted. The upper and lower ends of the probes 100a and 100b are supported by the upper insulating thin film member 540 and the lower insulating thin film member 550, respectively. As described in the previous embodiments, the thickness of the upper insulating thin film member 540 or the lower insulating thin film member 550 is determined within a range significantly lesser than the thickness of the socket body 510.

The plating layer 530 is formed on the surface of the ground hole 511 and makes electrical contact with the ground probe 100a to increase the grounding effect of the ground probe 100a. In addition, as previously described, the plating layer 530 serves to shield noise between the signal probes 100b together with the ground probe 100a disposed around the signal probes 100b. Preferably, the socket body 510 further includes an outer plating layer 531 on the upper surface thereof that is electrically connected to the plating layer 530. The outer plating layer 531 is provided on the upper surface of the socket body 510 to the extent that the outer plating layer 531 does not directly contact the signal probe to secure a large grounding area.

The upper insulating thin film member 540 is formed with a first through hole 541 that is at least smaller than the inner diameter of the ground hole 511 or the signal hole 512, the lower insulating thin film member 550 is provided with a second through hole 551 that also is smaller than the inner diameter of the ground hole 511 or the signal hole 512. The upper fixing protrusion 112 (see FIGS. 2A to 2D) and the lower fixing protrusion 122 (see FIGS. 2A to 2D) of the probe 100 are respectively caught on the first through hole 541 and the second through hole 551 of the upper insulating thin film member 540 and the lower insulating thin film member 550, limiting the upward and downward stroke range of the probe 100.

According to the socket device of this embodiment configured as described above, as in the previous embodiment (see FIG. 4), the upper ends and the lower ends of the probes 100a and 100b are supported by the thin film insulating members 540 and 550, respectively, and thus the socket body 510, which accommodates the probes 100a and 100b, may be manufactured by machining holes of a single diameter, making it easy to manufacture the socket device.

As described above, the socket device of the present disclosure includes: a socket body configured to accommodate a ground probe and a signal probe, each having an upper contact pin, a lower contact pin and a coil spring, and to have noise shielding properties; and an insulating thin film member having electrical insulation properties and attached to the lower part or upper/lower parts of the socket body to elastically support the probes, and thus the socket device has a thin structure suitable for ICs required to process high-speed signals, and is easy to manufacture.

As above, although the present disclosure has been described with limited embodiments and drawings, the scope of the present disclosure is not limited thereto, and various modifications and variations may be made by those skilled in the art in the technical field to which the present disclosure belongs within the scope of equivalency of the technical idea of the present disclosure and the claims set forth below.

What is claimed is:

1. A socket device for testing integrated circuits (ICs), the socket device comprising:
   a ground probe and a signal probe, each including:
      an upper contact pin,
      a lower contact pin, and
      a coil spring,
      wherein each of the upper contact pin and the lower contact pin has a pair of elastic parts symmetrically protruding in the longitudinal direction from an end thereof, and the upper contact pin and the lower contact pin are assembled in a crossed manner through the pairs of elastic parts such that the upper contact pin and the lower contact pin are configured to move longitudinally relative to each other, and
      wherein the coil spring is configured to elastically support the upper contact pin and the lower contact pin, and a crossing portion between the upper contact pin and the lower contact pin is disposed in an interior of the coil spring;
   a conductive socket body formed with a ground hole where the ground probe is accommodated and a signal hole where the signal probe is accommodated, and provided with a support portion for supporting upper ends of the ground probe and the signal probe;
   an insulating layer formed on a surface of the signal hole to electrically insulate the signal probe and the socket body; and
   an electrically-insulating lower insulating thin film member provided with a through hole where a lower tip portion of the ground probe or the signal probe protrudes to support lower ends of the probes, and attached to a lower part of the socket body.

2. The socket device of claim 1, wherein a thickness (h2) of the lower insulating thin film member is 5/100≤h2/h1≤20/100 with respect to a thickness (h1) of the socket body.

3. The socket device of claim 1, wherein the lower insulating thin film member is attached to the socket body using pressure-sensitive adhesives, adhesives, adhesive tapes, riveting, adhesion/bonding, or fusion.

4. The socket device of claim 1, wherein said each of the upper contact pin and the lower contact pin has a pair of fixing protrusions protruding to lateral sides, and the upper and lower contact pins are configured to be elastically supported from the coil spring by the pairs of fixing protrusions.

5. A socket device for testing integrated circuits (ICs), the socket device comprising:
   a ground probe and a signal probe, each including:
      an upper contact pin,
      a lower contact pin, and
      a coil spring,
      wherein each of the upper contact pin and the lower contact pin has a pair of elastic parts symmetrically protruding in the longitudinal direction from an end thereof, and the upper contact pin and the lower contact pin are assembled in a crossed manner through the pairs of elastic parts such that the upper contact pin and the lower contact pin are configured to move longitudinally relative to each other, and
      wherein the coil spring is configured to elastically support the upper contact pin and the lower contact pin, and a crossing portion between the upper contact pin and the lower contact pin is disposed in an interior of the coil spring;
   a socket body with electrical insulation properties formed with a ground hole where the ground probe is accommodated and a signal hole where the signal probe is accommodated, and provided with a support portion for supporting upper ends of the ground probe and the signal probe;
   a plating layer formed on a surface of the ground hole to make electrical contact with the ground hole; and
   an electrically-insulating lower insulating thin film member provided with a through hole where a lower tip portion of the ground probe or the signal probe protrudes to support lower ends of the probes, and attached to a lower part of the socket body.

6. The socket device of claim 5, wherein a thickness (h2) of the lower insulating thin film member is 5/100≤h2/h1≤20/100 with respect to a thickness (h1) of the socket body.

7. The socket device of claim 5, wherein the lower insulating thin film member is attached to the socket body using pressure-sensitive adhesives, adhesives, adhesive tapes, riveting, adhesion/bonding, or fusion.

8. The socket device of claim 5, wherein said each of the upper contact pin and the lower contact pin has a pair of fixing protrusions protruding to lateral sides, and the upper and lower contact pins are configured to be elastically supported from the coil spring by the pairs of fixing protrusions.

9. A socket device for testing integrated circuits (ICs), the socket device comprising:
   a ground probe and a signal probe, each including:
      an upper contact pin,
      a lower contact pin, and
      a coil spring,
      wherein each of the upper contact pin and the lower contact pin has a pair of elastic parts symmetrically protruding in the longitudinal direction from an end thereof, and the upper contact pin and the lower contact pin are assembled in a crossed manner through the pairs of elastic parts such that the upper contact pin and the lower contact pin are configured to move longitudinally relative to each other, and
      wherein the coil spring is configured to elastically support the upper contact pin and the lower contact pin, and a crossing portion between the upper contact pin and the lower contact pin is disposed in an interior of the coil spring;
   a conductive socket body formed with a ground hole where the ground probe is accommodated and a signal hole where the signal probe is accommodated;
   an insulating layer formed on a surface of the signal hole to electrically insulate the signal probe and the socket body;
   an electrically-insulating upper insulating thin film member provided with a first through hole where an upper tip portion of the ground probe or the signal probe protrudes to support upper ends of the probes, and attached to an upper part of the socket body; and an electrically-insulating lower insulating thin film member provided with a second through hole where a lower tip portion of the ground probe or the signal probe protrudes to support lower ends of the probes, and attached to a lower part of the socket body.

10. The socket device of claim 9, wherein a thickness (h2) of the lower insulating thin film member is 5/100≤h2/h1≤20/100 with respect to a thickness (h1) of the socket body.

11. The socket device of claim 9, wherein a thickness (h3) of the upper insulating thin film member is 5/100≤h3/h1≤20/100 with respect to a thickness (h1) of the socket body.

12. The socket device of claim 9, wherein the lower insulating thin film member is attached to the socket body using pressure-sensitive adhesives, adhesives, adhesive tapes, riveting, adhesion/bonding, or fusion.

13. The socket device of claim 9, wherein the upper insulating thin film member is attached to the socket body using pressure-sensitive adhesives, adhesives, adhesive tapes, riveting, adhesion/bonding, or fusion.

14. The socket device of claim 9, wherein said each of the upper contact pin and the lower contact pin has a pair of fixing protrusions protruding to lateral sides, and the upper and lower contact pins are configured to be elastically supported from the coil spring by the pairs of fixing protrusions.

15. A socket device for testing integrated circuits (ICs), the socket device comprising:
   a ground probe and a signal probe, each including:
      an upper contact pin,
      a lower contact pin, and
      a coil spring,
      wherein each of the upper contact pin and the lower contact pin has a pair of elastic parts symmetrically protruding in the longitudinal direction from an end thereof, and the upper contact pin and the lower contact pin are assembled in a crossed manner through the pairs of elastic parts such that the upper contact pin and the lower contact pin are configured to move longitudinally relative to each other, and
      wherein the coil spring is configured to elastically supporting the upper contact pin and the lower contact pin, and a crossing portion between the upper contact pin and the lower contact pin is disposed in an interior of the coil spring;
   a socket body with electrical insulation properties formed with a ground hole where the ground probe is accommodated and a signal hole where the signal probe is accommodated;
   a plating layer formed on a surface of the ground hole to make electrical contact with the ground hole;
   an electrically-insulating upper insulating thin film member provided with a first through hole where an upper tip portion of the ground probe or the signal probe protrudes to support upper ends of the probes, and attached to an upper part of the socket body; and
   an electrically-insulating lower insulating thin film member provided with a second through hole where a lower tip portion of the ground probe or the signal probe protrudes to support lower ends of the probes, and attached to a lower part of the socket body.

16. The socket device of claim 15, wherein a thickness (h2) of the lower insulating thin film member is 5/100≤h2/h1≤20/100 with respect to a thickness (h1) of the socket body.

17. The socket device of claim 15, wherein a thickness (h3) of the upper insulating thin film member is 5/100≤h3/h1≤20/100 with respect to a thickness (h1) of the socket body.

18. The socket device of claim 15, wherein the lower insulating thin film member is attached to the socket body using pressure-sensitive adhesives, adhesives, adhesive tapes, riveting, adhesion/bonding, or fusion.

19. The socket device of claim 15, wherein the upper insulating thin film member is attached to the socket body using pressure-sensitive adhesives, adhesives, adhesive tapes, riveting, adhesion/bonding, or fusion.

20. The socket device of claim 15, wherein said each of the upper contact pin and the lower contact pin has a pair of fixing protrusions protruding to lateral sides, and the upper and lower contact pins are configured to be elastically supported from the coil spring by the pairs of fixing protrusions.

* * * * *